(12) United States Patent
Uozumi

(10) Patent No.: US 8,222,160 B2
(45) Date of Patent: Jul. 17, 2012

(54) METAL CONTAINING SACRIFICE MATERIAL AND METHOD OF DAMASCENE WIRING FORMATION

(75) Inventor: Yoshihiro Uozumi, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 12/956,330

(22) Filed: Nov. 30, 2010

(65) Prior Publication Data

US 2012/0133044 A1    May 31, 2012

(51) Int. Cl.
 *H01L 21/461* (2006.01)
 *H01L 29/06* (2006.01)
(52) U.S. Cl. .................... 438/749; 257/623
(58) Field of Classification Search .......... 438/700, 438/978, 745–749; 257/622, 623, E21.221, 257/E21.223
See application file for complete search history.

(56) References Cited

U.S. PATENT DOCUMENTS

| | | | |
|---|---|---|---|
| 7,884,027 B2 * | 2/2011 | Uozumi et al. | 438/745 |
| 2006/0051969 A1 * | 3/2006 | Nakajima et al. | 438/758 |
| 2010/0323514 A1 | 12/2010 | Isobayashi et al. | |

FOREIGN PATENT DOCUMENTS

JP     2004530287     9/2004

* cited by examiner

Primary Examiner — Calvin Lee
(74) Attorney, Agent, or Firm — Turocy & Watson, LLP

(57) ABSTRACT

According to one embodiment, a via and trench are formed in a semiconductor structure. The via and the trench are suitable for having a metal-based wire placed therein by damascene, dual damascene, plating and other suitable techniques. The via is etched into a dielectric layer of a semiconductor structure comprising a base cap layer, the dielectric layer formed over the base cap layer, and a hardmask formed over the dielectric layer. The via is filled with a sacrifice material, where the sacrifice material contains a metal or a metal compound, where the sacrifice material additionally forms a sacrifice layer over the hardmask layer. The sacrifice material placed in the via does not contain a material or film containing a Si—O bond. The sacrifice material is used as a support for a photomask that is placed over the sacrifice layer, where the photomask is developed to have a trench pattern formed therein. Then, one or more of the hardmask layer and the dielectric layer is etched with the trench pattern, and the sacrifice material and the sacrifice layer are removed by contact with a remover solution containing one or more selected from an acidic compound, water, a base compound, and an oxidant.

16 Claims, 7 Drawing Sheets

A

B

METAL CONTAINING SACRIFICE MATERIAL AND METHOD OF DAMASCENE WIRING FORMATION

FIELD

Embodiments described herein generally relate to structures and methods for forming a metalized layer having a wire formed therein through use of a metal- or metal compound-containing sacrifice material.

BACKGROUND

In modern integrated semiconductors, metalized or wiring layers are formed over a semiconductor substrate to interconnect regions of the overall semiconductor device. The metalized layers make conductive contact with underlying layers to establish communication between different semiconductor devices formed on the semiconductor substrate.

As the dimensions of the wiring within the metalized layer are shrinked, the controllability of alignment between the wiring present in an upper layer with a lower underlying layer becomes problematic. Wiring is placed in a metalized layer by forming a pattern of vias and trenches in a dielectric material followed by filling with a conductive material. As the width of the pattern of vias and trenches is reduced, damage to the sidewalls of the vias and trenches due to dry etching and ashing processes employed in their formation leads to unpredictability of the final critical dimension (CD) and resulting alignment difficulties.

Often, a via first trench last (VFTL) scheme is employed to achieve greater accuracy in alignment compared to a trench first via last (TFVL) scheme. In VFTL schemes, the first-formed vias are filled with a sacrifice material that serves as a support for a photomask for patterning trenches. However, such sacrifice materials necessitate removal by chemical agents that introduce further damage to the dielectric materials present.

DETAILED DESCRIPTION

According to one embodiment, a via and a trench are formed in a semiconductor structure. The via and the trench are suitable for having a metal-based wire placed therein by damascene, dual damascene, plating and other suitable techniques. The via is etched into a dielectric layer of a semiconductor structure comprising a base cap layer, the dielectric layer formed over the base cap layer, and a hardmask formed over the dielectric layer. The via is filled with a sacrifice material, where the sacrifice material contains a metal or a metal compound, where the sacrifice material additionally forms a sacrifice layer over the hardmask layer.

The sacrifice material placed in the via does not contain a material or film containing Si—O bonds. The sacrifice material is used as a support for a photomask that is placed over the sacrifice layer, where the photomask is developed to have a trench pattern formed therein. Then, one or more of the hardmask layer and the dielectric layer is etched with the trench pattern, and the sacrifice material and the sacrifice layer are removed by contact with a remover solution containing one or more selected from an acidic compound, water, a base compound, and an oxidant such as hydrogen peroxide or ozone. The sacrifice material and the sacrifice layer are not contacted by either a solution having more than 30% by weight of an organic solvent or a solution having a fluorine-containing organic compound.

Figure 1:
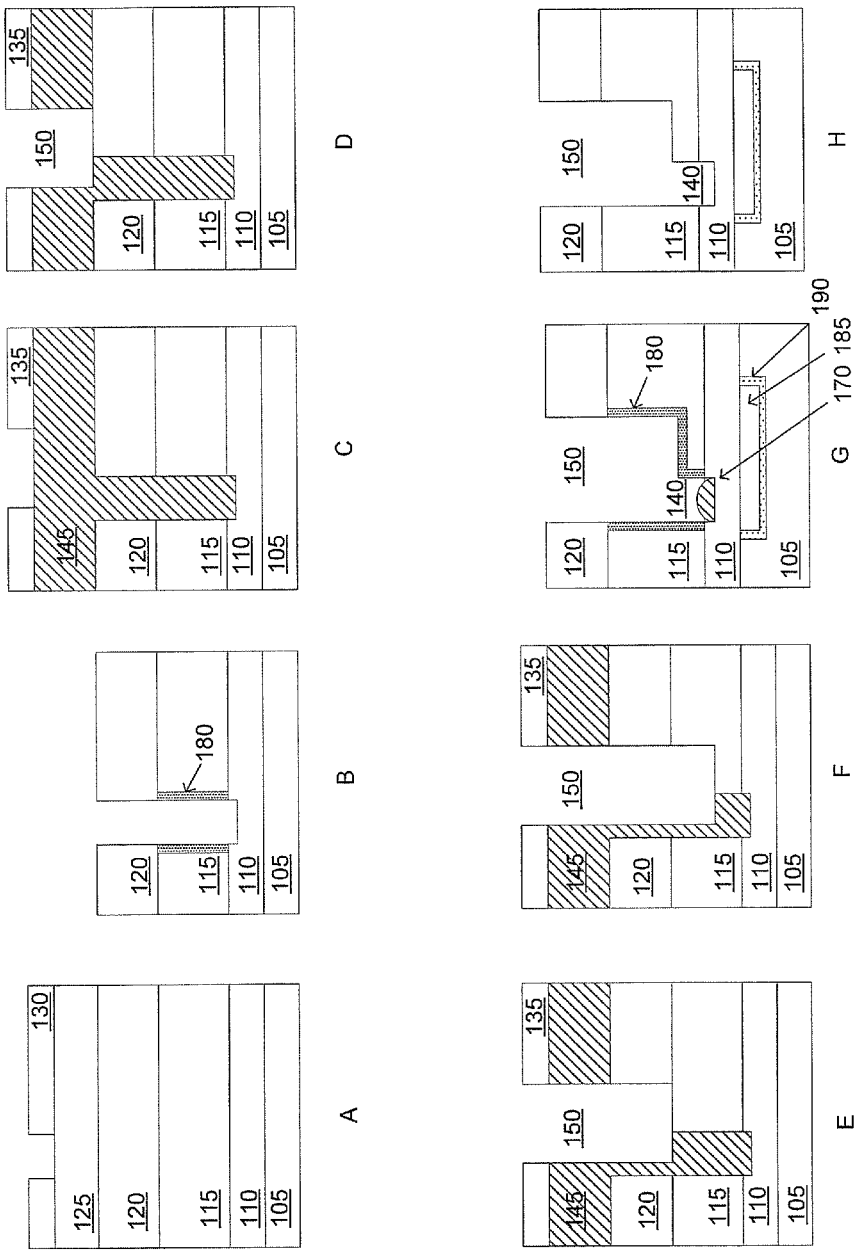
FIGS. 1A-1H show embodiment methodologies and structures for forming a via and a trench.

FIGS. 1A-1H, show exemplary methodologies and structures for the formation of a metalized layer. FIG. 1A shows a structure having a base cap layer 110 formed over an underlying layer 105. A dielectric layer 115 is formed over the base cap layer 110, a hardmask layer 120 is formed over the dielectric layer 115, and a photoabsorption layer 125 is formed over the hardmask layer 120.

The dielectric layer 115 is formed of any dielectric material suitable for use as an insulator within the semiconductor structure. In one embodiment, the dielectric material is silicon dioxide. In another embodiment, the dielectric material is a low-k material that has a dielectric constant less than the dielectric constant of silicon dioxide. A low-k material can contain silicon atoms. In yet another embodiment, the dielectric material is a porous SiCOH material.

A metalized layer is formed from the dielectric layer 115. The sacrifice material that will be described below is useful for forming a pattern of vias and trenches in the dielectric layer 115. Upon formation of a desired pattern of vias and trenches, a metallic wire or wires can be placed into the pattern of vias and trenches through known damascene and dual damascene techniques to form a metalized layer. That is, a metalized layer contains a dielectric material with a wire or wires placed into a pattern of vias and trenches, wherein a sacrifice material is used in the process of forming the patterns of vias and trenches. The metalized layer is formed over an underlying layer or layers 105, which can be one or more of another metalized layer, a device layer upon which transistors, capacitors, and/or other device structures are formed, and a semiconductor substrate.

In one embodiment, the width of the metal wire or wires is from about 25 nm to about 10 μm. In another embodiment, the width of the metal wire or wires is from about 30 nm to about 1 μm. In yet another embodiment, the width of the metal wire or wires is from about 30 to about 500 nm.

In FIG. 1A, a photomask 130 is placed over the photoabsorption layer 125 and the photomask 130 is patterned to have a via pattern formed therein. Reactive ion etching (RIE) and ashing are performed using known techniques to transfer the via pattern into the hardmask layer 120 and dielectric layer 115 to form via 140. Ashing affects the removal of the photoabsorption layer 125. The etching can extend the via through the base cap layer 110 to make contact with the underlying layer (i.e., cap open) or the etching can stop short of reaching the underlying layer, where a cap open act can be performed in a downstream process.

The RIE and/or the ashing processes remove the photoabsorption layer 125 and the photomask 130. However, this process is performed after the act of using RIE to form via 140, which exposes the dielectric material in layer 115. As such, the RIE process often induces damage 180 to the material of the sidewalls of via 140. Any RIE and/or ashing act performed after the formation of via 140 has the potential to introduce damage to the sidewalls of via 140 regardless of whether or not damage is specifically illustrated in the drawings. After trench formation, described below, the via 140 can be extended to make contact with the underlying layer 105 in a "cap open" act, which also has the potential to introduce further damage to the sidewalls of via 140.

In order to form a trench, via 140 is filled with a sacrifice material, where the sacrifice material also forms a sacrifice layer 145 over the hardmask layer 120, as shown in FIG. 1C. The sacrifice material serves as a support for a photomask 135 having a trench pattern formed therein placed over the sacrifice layer 145. The photomask 135 can have an additional hardmask and/or a photoabsorption layer. The via pattern and the trench pattern typically overlap over the horizontal surface of the hardmask layer 120 and dielectric layer 115, which necessitates that the via 140 is filled with the sacrifice material/layer 145 to provide support for photomask 135.

As shown in FIGS. 1D-1F, the trench pattern is etched into the sacrifice layer 145, the hardmask layer 120, and the dielectric layer 115 in a series of known etching processes. Reactive ion etching or other known etching techniques can be used to transfer the trench pattern from the photomask 135 to the hardmask 120 and dielectric 115 layers. FIG. 1D shows an etching act that transfers the trench pattern to the sacrifice layer 145. FIG. 1E shows an etching act that transfers the trench pattern to hardmask layer 120. FIG. 1F shows an etching act that transfers the trench pattern to the dielectric layer 115.

Typically, the sacrifice material/layer 145 is a resist or film formed from a substance containing a Si—O bond. Such sacrifice materials can be removed by contact with organic solvents and organic remover compounds containing fluorine. As shown in FIG. 1G, residual sacrifice material 170 located toward the bottom of the via is often difficult to remove with wet techniques and remains behind after attempted removal. FIG. 1G also shows the underlying layer 105 in more detail as an underlying metalized layer having a wire 185 and a barrier metal layer 190.

Wet removal of the sacrifice material/layer 145 with organic removers can introduce damage 180 to the sidewalls of via 140, where such damage is in addition to the any ashing act performed previously. Dry techniques, such as plasma etching, can be used to remove the sacrifice material 145 and/or to remove the residual material 170 at the bottom of via 140 left behind after attempted wet removal. However, such techniques also induce damage 180 on the sidewalls of via 140 as well as to the sidewalls of trench 150. Introduction of damage 180 is often remedied by widening the width of via 140 and trench 150. As a result, such processes add additional costs and difficulty in controlling the critical dimension (CD) of any final formed device.

In FIG. 1H, the via 140 is extended to make contact with underlying layer 105 in a "cap open" act. The performance of a "cap open" act can be an additional source of damage to the sidewalls of via 140.

Specific embodiments in accordance with the innovations disclosed herein will be described. The innovations disclosed herein allow for the placement and use of a sacrifice material containing metal or a metal compound removable through contact with one or more of a low oxidation acid, water, and a base compound. As such, the metal-containing sacrifice material can be removed without the use of organic solvents, fluorine containing removers, or dry etching that can induce damage to the sidewalls of the vias. Further, the metal-containing sacrifice material is removed cleanly without hard-to-remove deposits forming in the via.

Those skilled in the art will recognize that well-known semiconductor fabrication techniques including depositing materials, masking, photolithography, etching, and implanting are useful in forming the described devices or structures. Deposition of materials for forming semiconductor structures can be by low pressure chemical vapor deposition, chemical vapor deposition, atomic layer deposition, and the like. Conserved reference numbers match like elements.

Terms, such as "on," "above," "below," and "over," used herein, are defined with respect to the plane defined by the surface of a semiconductor substrate. The terms "on," "above," "over," etc. indicate that the subject element is farther away from the plane of the semiconductor substrate than another element referred to as a spatial reference. The term "below" and similar terms indicate that the subject element is closer to the plane of the semiconductor substrate than another element referred to as a spatial reference. The terms "on," "above," "below," and "over," etc. only indicate a relative spatial relationship and do not necessarily indicate that any particular elements are in physical contact. The preceding definitions apply throughout this document. A figure or a parameter from one range may be combined with another figure or a parameter from a different range for the same characteristic to generate a numerical range.

Figure 2:
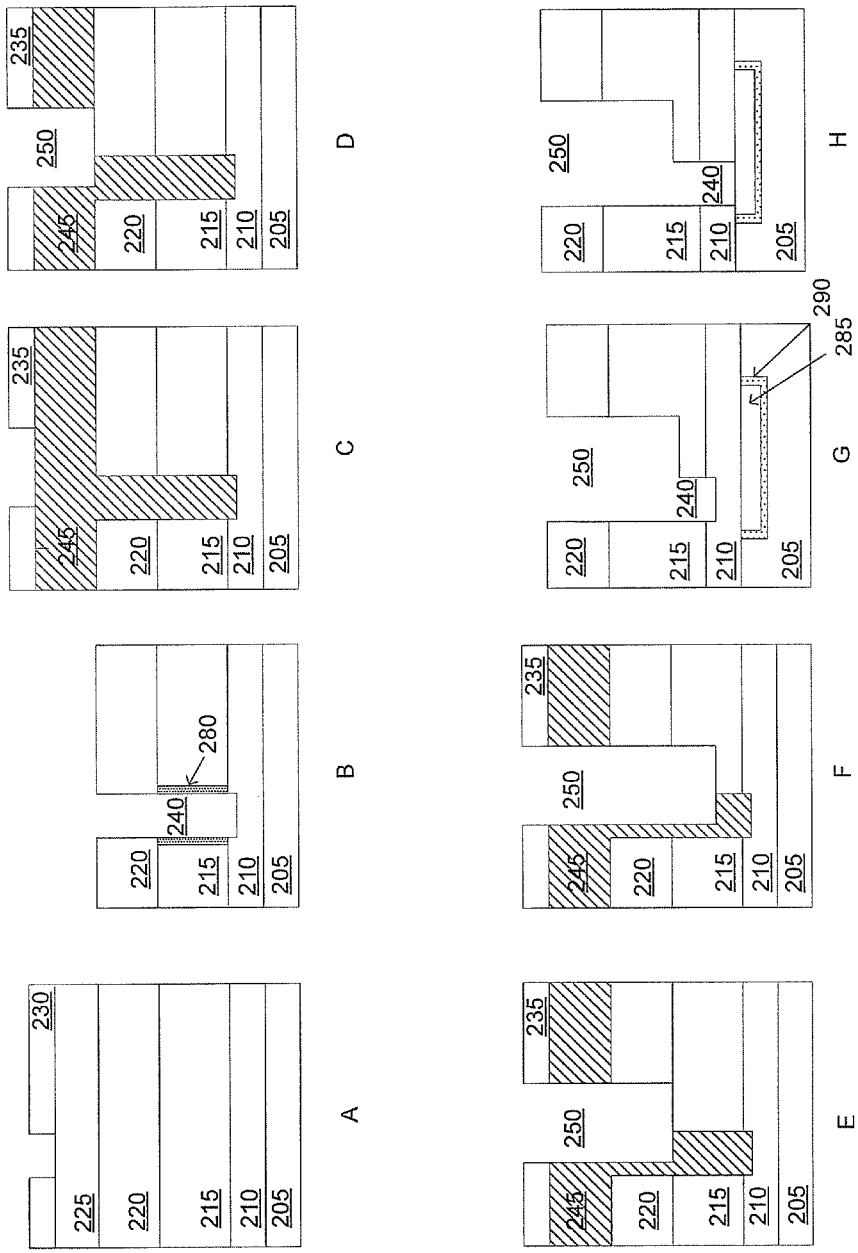
FIGS. 2A-2H show embodiment methodologies and structures for forming a via and a trench using a sacrifice material containing a metal or metal compound.

In reference to FIGS. 2A-2H, one embodiment in accordance with the innovations disclosed herein will be described. As shown in FIG. 2A, a structure useful for the formation of a metalized layer has a base cap layer 210 formed over an underlying layer 205. A dielectric layer 215 is formed over the base cap layer 210, a hardmask layer 220 is formed over the dielectric layer 215, and a photoabsorption layer 225 is formed over the hardmask layer 220. The structure is processed such that a pattern of vias and trenches are formed in the dielectric layer 215 allowing for placement of a metal wire therein.

The dielectric layer 215 is formed of any dielectric material suitable for use as an insulator within the semiconductor structure in layer 215. In one embodiment, the dielectric material is silicon dioxide. In another embodiment, the dielectric material is a low-k material that has a dielectric constant less than the dielectric constant of silicon dioxide. A low-k material can contain silicon atoms. In yet another embodiment, the dielectric material is a porous SiCOH material.

FIGS. 2A-2B describe formation of a via pattern within dielectric layer 215. A photomask 230 is placed over the photoabsorption layer 225 and the photomask 230 is patterned to have a via pattern formed therein. RIE and ashing are performed using known techniques to transfer the via pattern into the hardmask 220 and dielectric 215 layers. The etching can extend the via through the base cap layer 210 to make contact with the underlying layer (i.e., cap open) or the etching can stop short of reaching the underlying layer. FIG. 2B shows the via 240 stopping short of reaching the underlying layer 205. The ashing process removes the photoabsorption layer 225 and the photomask 230. As intrinsic to most ashing processes, the act of ashing damages the dielectric material forming the sidewalls of via 240, as indicated by the shaded area of reference number 280.

The via 240 is filled with a sacrifice material, where the sacrifice material also forms a sacrifice layer 245 over the hardmask layer 220. In accordance with embodiments of the innovations disclosed herein, the sacrifice material contains a metal or metal compound that can be deposited by PVD, CVD, plating or spin-on methods. Where a spin-on method is employed, such as the known sol-gel method, planarization after deposition is facilitated. The material of the sacrifice layer is not limited to any particular metal or metal compound provided that such metal or metal compound is removable by water or an aqueous solution, as described below. Since the wiring that can be present in underlying layer 205 frequently contains copper, in an embodiment the metal or metal compound is removable by an aqueous solution that does not react with nor promote the rapid corrosion of copper. The solution used to remove the sacrifice material can be referred to as a remover solution.

Many metals and metal compounds are readily oxidized as to be dissolved and removed by an aqueous remover solution. In an embodiment, the remover solution is any aqueous solution having the ability to dissolve the metal or metal compound of the sacrifice material while not promoting the rapid dissolution of any copper-containing components. In one embodiment, the remover solution is an aqueous solution that contains an acid where hydrogen ions are capable of oxidizing the metal or metal compound of the sacrifice material to affect dissolution of the sacrifice material.

In one embodiment, the metal or metal compound of the sacrifice material is removable by an aqueous solution of an acid with a low oxidation potential such as hydrochloric acid, phosphoric acid, sulfuric acid, carbonic acid, carboxylic acid or an organic acid such as acetic acid, citric acid, glycolic acid and so on. As defined herein, an acid with a low oxidation potential is an acid that does not dissociate into anions capable of reducing to more reduced species by a redox half-reaction having a standard potential for such reduction more positive than about 0.2 mV. In another embodiment, an acid with a low oxidation potential is an acid that does not dissociate into anions having a standard electrode potential for reduction greater than about 0.3 mV.

Copper has a standard potential of 0.34 mV for the half-reaction $Cu^{2+}$ reduction to Cu. As such, copper is not readily oxidized, corroded or dissolved by low oxidation potential acids. For example, the remover solution does not contain an acidic compound that dissociates into an oxidizing ion, such as nitric acid. The remover solution can contain dilute sulfuric acid. The observed oxidation potential of any particular remover solution depends of several factors including the pH and concentration of the aqueous acid solution.

In one embodiment, the remover solution has a pH greater than −2 and less than about 5. In another embodiment, the remover solution has a pH greater than about 1 and less than about 5. In yet another embodiment, the remover solution has a pH greater than about 3 and less than about 5. In one embodiment, the concentration of acid in the remover solution is less than about 5M. In another embodiment, the concentration of acid in the remover solution is less than about 1 M. In yet another embodiment, the concentration of acid in the remover solution is from about 50 mM to about 500 mM. In another embodiment, the remover solution is water or a solution of a neutral or basic compound. In yet another embodiment, the remover solution contains hydrogen peroxide or an organic peroxide compound.

In one embodiment, the remover solution does not contain an organic solvent or a fluorine-containing organic compound. However, those having skill in the will recognize that small amounts of organic solvents can be included without have significant adverse effects, such as damaging the sidewalls of the via. In one embodiment, the remover solution can have about 30% or less by weight of an organic solvent. In another embodiment, the remover solution can have about 10% or less by weight of an organic solvent. Examples of organic solvents include alcohols and solvents obtained by the distillation of petroleum including methanol, ethanol, isopropanol, acetone, benzene, toluene, alkane ethers, and straight-chained or branched alkanes.

The sacrifice material can contain a metal, a metal compound or a metal alloy that is readily dissolved by a solution having an acidic pH. Generally, such metals, compounds and alloys have a negative standard electrode potential for the reduction of a corresponding metal ion. Certain metals, metal compounds, and alloys, such as strontium oxide and strontium titanium oxide (STO), can be dissolved by a neutral or alkaline remover solution in addition to acidic solutions. For example, plain water can dissolve strontium oxide and STO.

A sacrifice material of titanium nitride (TiN) or tungsten can be dissolved by a remover solution containing acid or a remover solution containing a neutral or basic compound such as hydrogen peroxide, ammonia, tetramethylammonium hydroxide (TMAH), tetraethylammonium hydroxide (TEAH), choline, and mixtures thereof.

A sacrifice material containing manganese or manganese oxide can be dissolved by a remover solution containing hydrochloric acid, carbonic acid, phosphoric acid, or dilute sulfuric acid.

As shown in FIGS. 2D-2F, the trench pattern is etched into the sacrifice layer 245, the hardmask layer 220, and the dielectric layer 215 in a series of known etching processes. A resist 235 is placed over the sacrifice layer 245 and patterned and developed with a trench pattern to be transferred to the hardmask layer 220 and the dielectric layer 215. In FIG. 2D, a first etching act is performed that extend the trench through the sacrifice layer 245 to the hardmask layer 220. In FIG. 2E, the trench is extended by etching into the hardmask layer 220 to the dielectric layer 215. In one embodiment, the resist 235 is removed after etching the hardmask layer 220. In another embodiment, the resist 235 can be left in place after etching the hardmask layer 220.

The trench 250 is completed by extension into the dielectric layer 235 as shown in FIG. 2F. In one embodiment, the resist 235 is removed after completion of the trench etching. In another embodiment, the resist 235 is removed during the act of etching the trench 250.

As shown in FIG. 2G, the sacrifice material and layer 245 are removed after completion of the etching of the trench 240. The sacrifice material is removed by a wet process by contacting the sacrifice material with a remover solution appropriate for removal of the particular sacrifice material present. In one embodiment, the remover solution does not contain an organic compound having a fluorine atom. The remover solution, as described herein, substantially removes all of the sacrifice material/layer 245 such that via 240 and trench 250 are free from sacrifice material filled therein.

For example, a sacrifice material containing one or more of TiN and tungsten can be removed by contact with a remover solution containing one or more selected from dilute sulfuric acid, hydrochloric acid, hydrogen peroxide, ammonia, TMAH, TEAH, choline, a mixture of ammonia and hydrogen peroxide, a mixture of TMAH and hydrogen peroxide, a mixture of TEAH and hydrogen peroxide, and a mixture of choline and hydrogen peroxide. A sacrifice material containing one or more of manganese or manganese oxide can be removed by contact with a remover solution containing one or more selected from hydrochloric acid, carbonic acid, phosphoric acid, and dilute sulfuric acid. A sacrifice material containing one or more of tin, tin oxide, indium tin alloy and indium tin oxide can be removed by contact with a remover solution containing one or more selected from water, acidic solutions, and alkaline solutions.

In one embodiment, the remover solution is contacted with the sacrifice material from about 3 seconds to about 60 minutes. In another embodiment, the remover solution is contacted with the sacrifice material from about 5 seconds to about 30 minutes. In yet another embodiment, the remover solution is contacted with the sacrifice material from about 10 seconds to about 15 minutes. In still another embodiment, the remover solution is contacted with the sacrifice material from about 30 seconds to about 5 minutes.

In one embodiment, the remover solution is contacted with the sacrifice material at a temperature from about 5 to about 90° C. In another embodiment, the remover solution is contacted with the sacrifice material at a temperature from about 10 to about 50° C. In another embodiment, the remover solution is contacted with the sacrifice material at a temperature from about 20 to about 40° C.

In FIG. 2H, the via 240 is extended to make contact with underlying layer 205 in a "cap open" act. Although the ashing performed to remove the photoabsorption layer 225 and the performance of the "cap open act" can introduce damage to the sidewalls of the via 240 and/or trench 250, the methodologies illustrated in FIGS. 2A-2H substantially reduce the amount of damage to the sidewalls due to the non-use of an organic solvent or an organic compound containing fluorine for removal of the sacrifice material. That is, in one embodiment an organic solvent or an organic compound containing fluorine is not contacted with the structure prior to removal of the sacrifice material.

Figure 3:
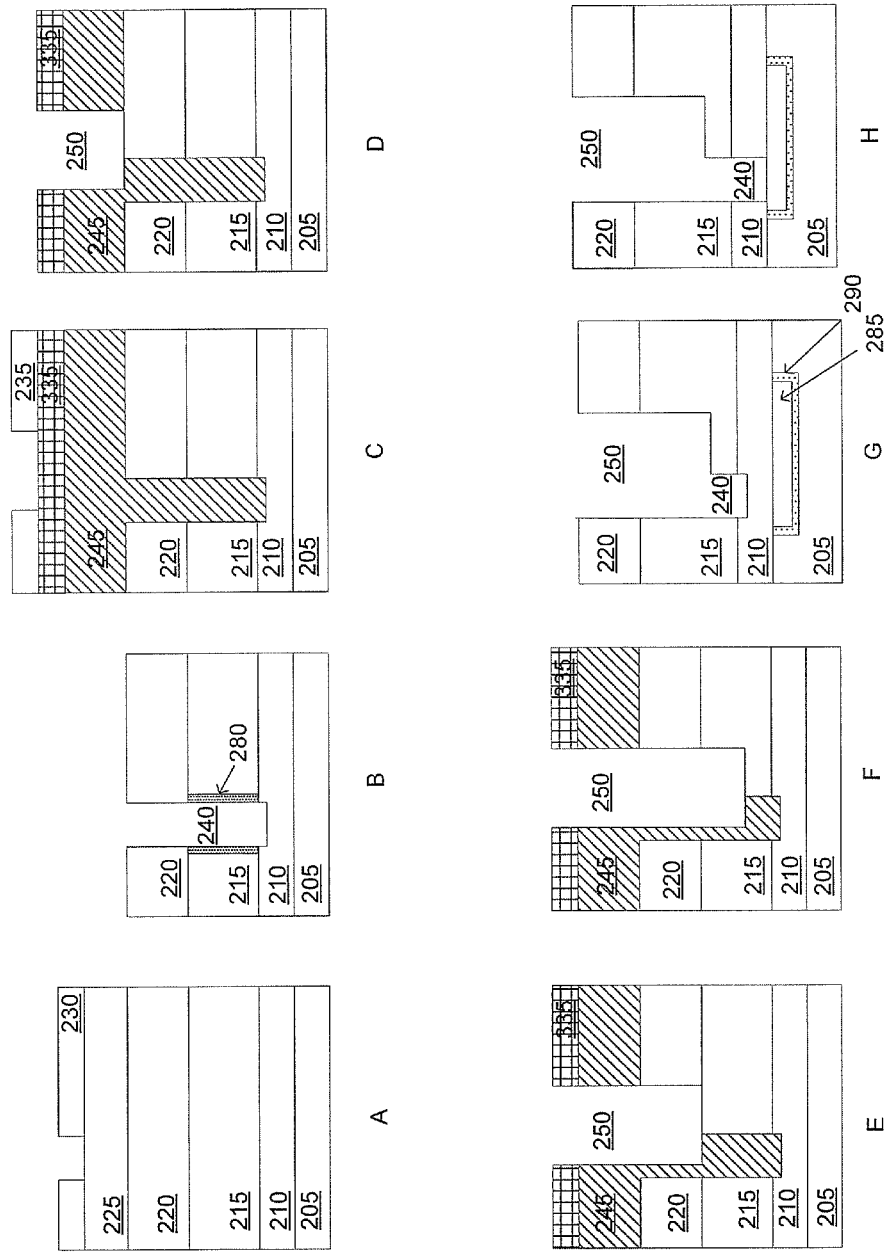
FIGS. 3A-3H show embodiment methodologies and structures for forming a via and a trench using a sacrifice material containing a metal or metal compound and a metal hardmask.

FIGS. 3A-3H exemplify additional embodiments in accordance with the innovations disclosed herein. Like reference numbers between FIGS. 2A-2H and 3A-3H indicate like features. In FIGS. 3A-3B, a photomask 230 having a via pattern developed therein is placed over a semiconductor structure having a photoabsorption layer 225, a hardmask layer 220, a dielectric layer 215, a base cap layer 210 and an underlying layer 205, as described above. The via pattern is transferred to the hardmask layer 220 and the dielectric layer 215 by RIE and the photoabsorption layer 225 is removed by ashing. As described above, the ashing process can introduce damage 280 to the sidewalls of via 240.

In FIG. 3C, the via 240 is filled with a sacrifice layer 245 containing a metal or metal compound, as described above, where the sacrifice material forms a layer 245 over the hardmask layer 220. In addition, a metal hardmask 335 is placed over the sacrifice layer 245 followed by a photomask 235 having a trench pattern developed therein.

In FIG. 3D, the trench pattern 250 from the photomask 235 is transferred to the metal hardmask 335 and the sacrifice layer 245. Thereafter, the photomask 235 is removed and the trench pattern transferred to the metal hardmask 335 serves as the template for the trench pattern 250 in downstream etching acts. As shown in FIGS. 3E and 3F, the metal hardmask 330 acts as a template for the trench pattern in transferring the trench pattern 250 to the hardmask layer 220 and the dielectric layer 215.

In FIG. 3G, the sacrifice layer/material is removed by contact with the remover solution, as described above. The metal hardmask 335 can be removed by contact with the same solution or by contact with an another solution sequentially. After removal of the metal hardmask and/or the sacrifice material, a via 240 and trench 250 are left without sacrifice material substantially filled therein. In FIG. 3H, the via 240 is extended to reach the underlying 205 in a "cap open" act, as described above.

Figure 4:
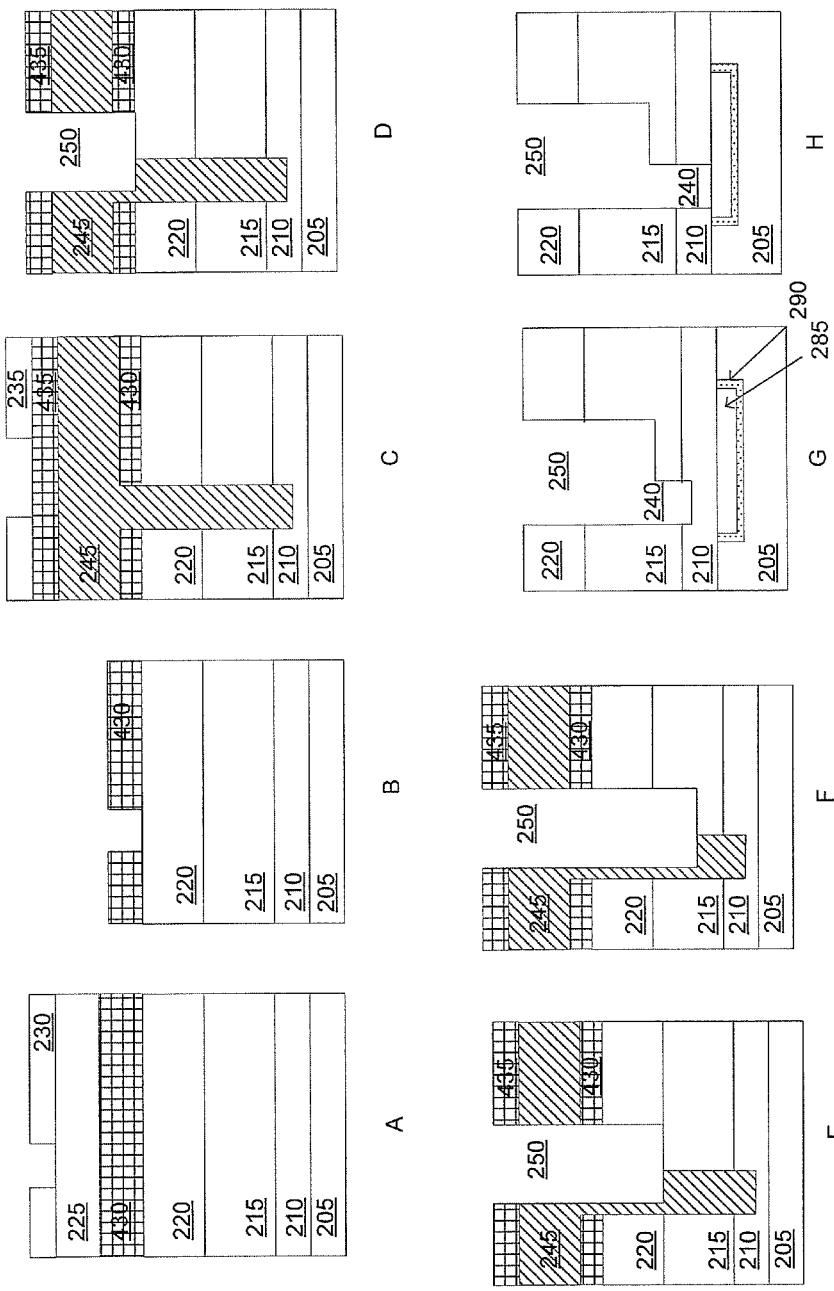
FIGS. 4A-4H show embodiment methodologies and structures for forming a via and a trench using a sacrifice material containing a metal or metal compound.

FIGS. 4A-4H exemplify additional embodiments in accordance with the innovations disclosed herein. Like reference numbers between FIGS. 2A-2H and 4A-4H indicate like features. In FIGS. 4A-4B, a photomask 230 having a via pattern developed therein is placed over a semiconductor structure having a photoabsorption layer 225, a metal hardmask layer 430, a hardmask layer 220, a dielectric layer 215, a base cap layer 210 and an underlying layer 205, as described above.

The via pattern is transferred to the metal hardmask layer 430 by RIE and the photoabsorption layer 225 is removed by ashing. As described above, ashing processes have the potential to damage the sidewalls of vias and/or trenches. However, as shown in FIG. 4B, the via pattern is not extended into the hardmask layer 220 nor the dielectric layer 215 at the time of etching the metal hardmask layer 430. As such, the ashing process to remove the photoabsorption layer 225 does not introduce any damage to hardmask layer 220 and dielectric layer 215.

After etching the metal hardmask layer 430, the via pattern is then extended into the hardmask layer 220 and dielectric layer 215 by RIE etching. Since the via pattern is transferred to the metal hardmask 430 during the above-described etching step, the metal hardmask can serve as a template for transferring the via pattern to the hardmask layer 220 and the dielectric layer 215 to form a via 240. As shown in FIG. 4C, the via 240 is then filled with the sacrifice material and a sacrifice layer 245 is formed over the hardmask layer 220, as described above. If necessary, an additional metal hard mask layer 435 can be then formed over the sacrifice layer. A photomask 235 having a trench pattern developed therein formed over the hardmask 220 or the metal hardmask 435.

As shown in FIG. 4D, the trench pattern from photomask 235 is transferred to the additional metal hardmask 435, the sacrifice layer 245 and the metal hardmask 430, and the photomask 235 is removed. As shown in FIGS. 4E and 4F, the metal hardmask 435 acts as a template for the trench pattern 250 for etching the hardmask layer 220 and the dielectric layer 215.

In FIG. 4G, the sacrifice layer/material is removed by contact with the remover solution, as described above. The metal hardmask 435 can be removed by contact with the same solution or by contact with an another solution sequentially. After removal of the metal hardmask and/or the sacrifice material, a via 240 and trench 250 are left without sacrifice material substantially filled therein. In FIG. 4H, the via 240 is extended to reach the underlying 205 in a "cap open" act, as described above. Since the hardmask layer and the dielectric layer 240 is not exposed to an ashing act, the amount of damage introduced to the sidewalls of via 240 and trench 250 is substantially reduced.

Figure 5:
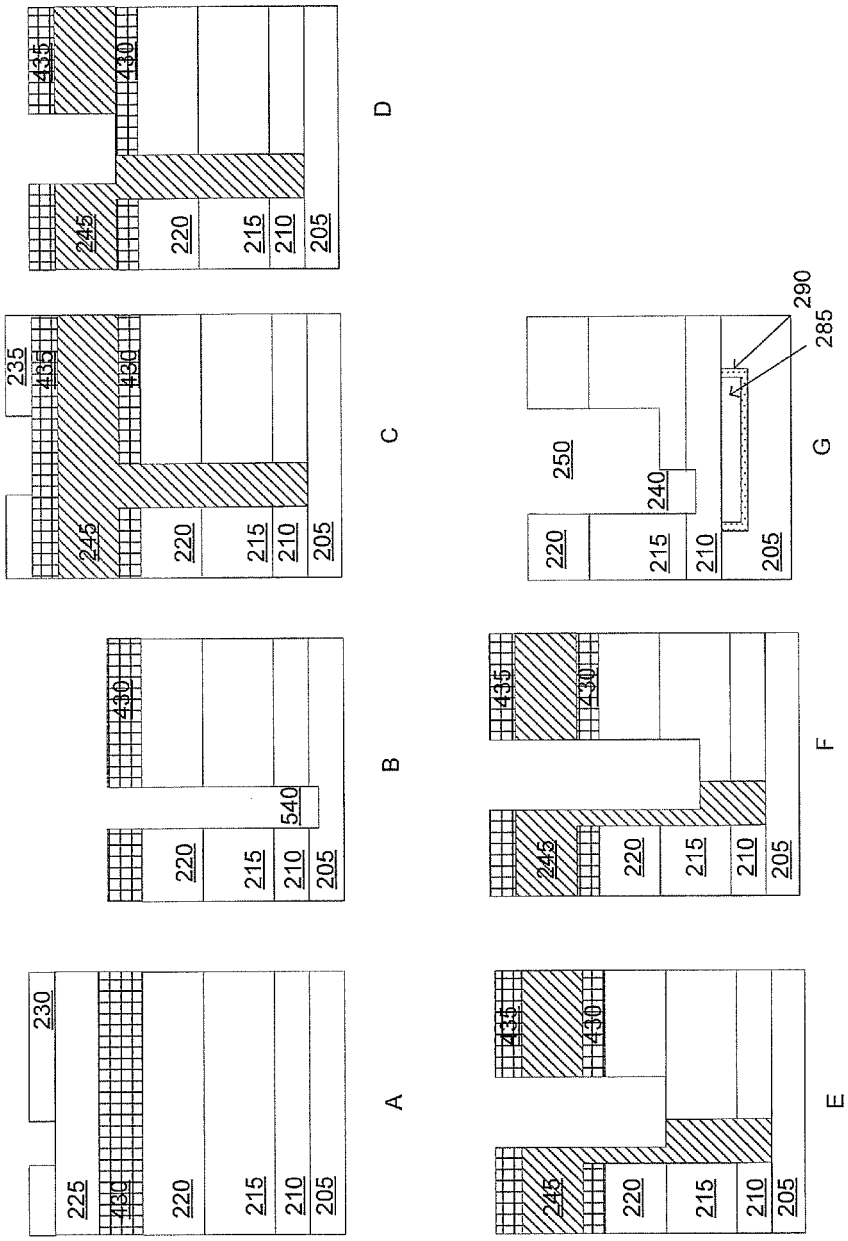
FIGS. 5A-5G show embodiment methodologies and structures for forming a via with a cap open act and a trench using a sacrifice material containing a metal or metal compound.

FIGS. 5A-5G show an additional embodiments. Like numbering between FIGS. 4A-4H and FIGS. 5A-5G indicates like features. FIG. 5A shows a semiconductor structure having the features and layers described above. In FIG. 5B, the via pattern from photomask 230 is transferred to metal hard mask layer 430 in a first etching act. Then, the photomask 230 and the photoabsorption layer 225 are removed by an ashing process. After ashing, via 540 is formed extending down to the underlying layer 205 by RIE. That is, the "cap open" act is performed prior to etching of a trench pattern in downstream acts. As such, a separate "cap open" act is eliminated and any additional damage that can potentially be introduced into the sidewalls of via 540 and/or trench by performance of a separate "cap open act" is minimized.

In FIGS. 5C-5F, the via 540 is filled with sacrifice material having a metal or metal compound and a second metal hardmask layer 435, such as a metal hardmask or Si-containing hardmask, and photomask 235 having a trench pattern are placed over the sacrifice layer 245. The trench is then etched into the second metal hardmask layer 435, hardmask layer 220, and dielectric layer 215, as described above. FIG. 5H shows a formed via 540 and trench 250 substantially free from sacrifice material after contact with the above-described remover solution.

Figure 6:
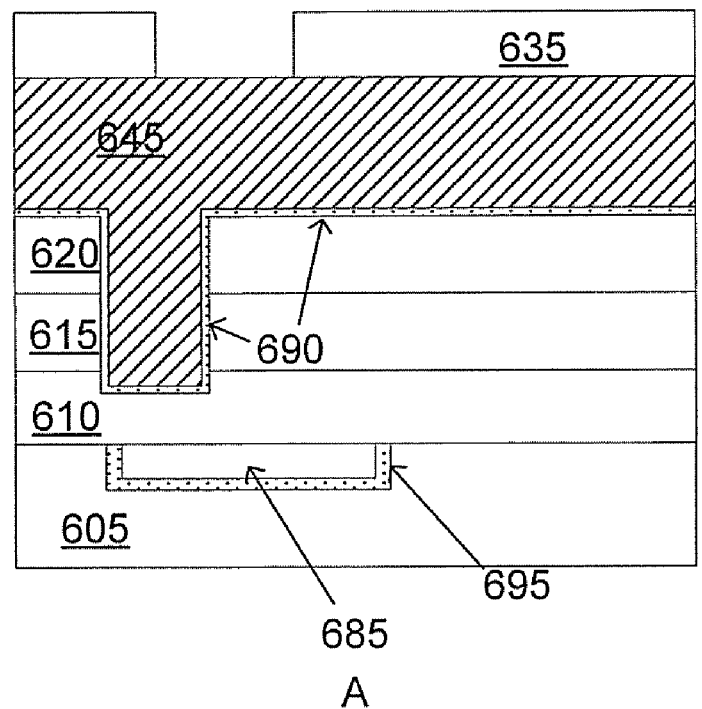
FIGS. 6A and 6B show embodiment methodologies and structures for forming a self-formed barrier layer using a sacrifice material containing a metal or metal compound.
Figure 6:
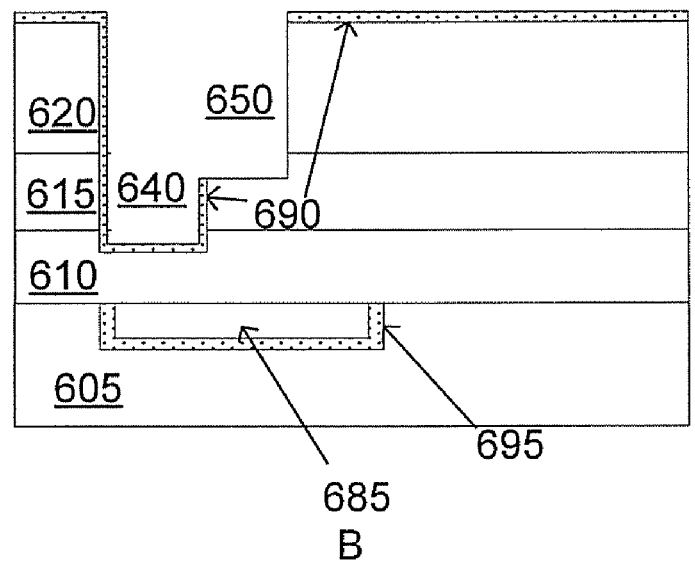

FIG. 6 shows additional advantages obtainable by the innovations disclosed herein. FIG. 6A shows a view of the sacrifice material 645 filled into a via etched into a hardmask layer 620, a dielectric layer 615 and a base cap layer 610. Underlying layer 605 is shown as an exemplary metalized layer having a wire 685 with a barrier metal layer 695. The sacrifice material 645 serves to support a photomask 635 having a trench pattern formed thereon. The metal or metal compound material of the sacrifice material 645 can self-form a barrier metal layer 690 interposed between the bulk of the sacrifice material 645 and the hardmask layer 620 and the dielectric layer 615. The barrier metal layer 690 can form by the sacrifice material reacting with the material of the hardmask layer 620 and/or the dielectric layer 615 to form a metal oxide or a metal silicon oxide. In one embodiment, the metal barrier layer contains one or more selected from titanium oxide, titanium silicon oxide, manganese oxide, and manganese silicon oxide. The trench pattern is etched in accordance with any of the embodiments described above.

The trench pattern of photomask 635 is etched into hardmask layer 620 and dielectric layer 615 to form trench 650. Then, the sacrifice material 645 is removed by contact with the remover solution, as described above to yield the structure shown in FIG. 6B. The barrier metal layer 690 is left lining the via 640 and surfaces that were in contact with the sacrifice material 645 at the time of placement of the sacrifice material. The structure having the barrier metal layer 690 can then be further processed in downstream acts. An advantageous feature of the barrier metal layer 690 is that the barrier metal layer can protect the dielectric layer 615 against additional damages due to further processes such as a "cap open."

Figure 7:
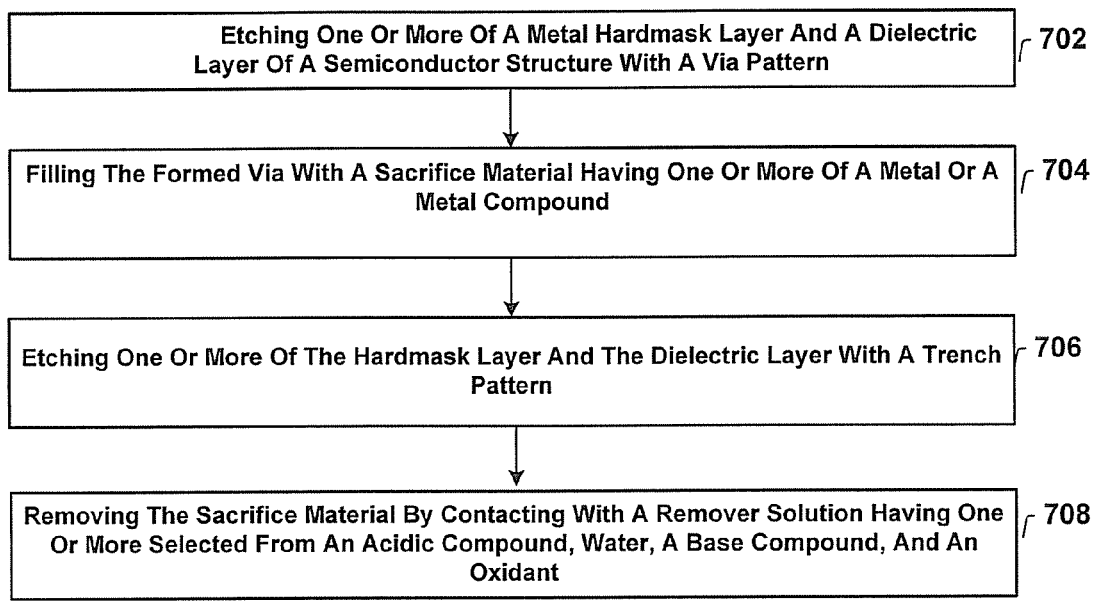
FIG. 7 shows a flow process for forming a via and a trench.

In order to fully describe the innovations disclosed herein, acts for forming a via and trench pattern in a semiconductor structure will be described in reference to FIG. 7. In act 702, one or more of a hardmask layer and/or a dielectric layer is etched with a via pattern, the structure having at least a semiconductor substrate, a base cap layer formed over the semiconductor substrate, the dielectric layer formed over the base cap layer, and a hardmask formed over the dielectric layer. In act 704, the via formed in the dielectric layer and/or the hardmask layer is filled with a sacrifice material having a metal or a metal compound, and a sacrifice layer formed of the sacrifice material is formed over the hardmask layer. In act 706, one or more of the hard mask layer and the dielectric layer are etched with a trench pattern. In act 708, the sacrifice material is removed by contact with a remover solution having one or more selected from an acidic compound, water, a base compound, and an oxidant with the proviso that the sacrifice material and the sacrifice layer is not contacted by either a concentrated organic solvent or a fluorine-containing organic compound. A concentrated organic solvent has more than about 30% by weight of an organic solvent.

With respect to any figure or numerical range for a given characteristic, a figure or a parameter from one range may be combined with another figure or a parameter from a different range for the same characteristic to generate a numerical range.

While certain embodiments have been described, these embodiments have been presented by way of example only, and are not intended to limit the scope of the inventions. Indeed, the novel methods and semiconductor structures described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method for forming a via and trench pattern in a semiconductor structure formed on a semiconductor substrate, comprising:
    etching a via into a dielectric layer of the semiconductor structure formed on a semiconductor substrate, the semiconductor structure comprising a base cap layer, a dielectric layer formed over the base cap layer, and a hardmask formed over the dielectric layer;
    filling the via with a sacrifice material, the sacrifice material comprising a metal or a metal compound;
    placing a photomask over the semiconductor structure, where the photomask is developed to have a trench pattern;
    etching one or more of the hardmask layer and the dielectric layer with the trench pattern; and
    removing the sacrifice material by contact with a remover solution comprising one or more selected from the group consisting of an acid compound, water, a base compound, and an oxidant with the proviso that the sacrifice material and the sacrifice layer is not contacted by either a solution comprising more than 30% by weight of an organic solvent or a solution comprising a fluorine-containing organic compound.

2. The method of claim 1, wherein the acidic compound is a low oxidation acid.

3. The method of claim 1, wherein the acidic compound is one or more selected from the group consisting of hydrochloric acid, carbonic acid, a carboxylic acid, phosphoric acid, sulfuric acid, and an organic acid.

4. The method of claim 1, wherein the dielectric layer comprises one or more selected from a porous SiCOH material and a low-k material.

5. The method of claim 1, wherein the sacrifice material does not comprise a material or film containing Si—O bonds.

6. The method of claim 1, wherein the sacrifice material comprises one or more selected from the group consisting of titanium, titanium nitride, tungsten, tungsten nitride, manganese, manganese oxide, tin, tin oxide, strontium oxide, strontium tin oxide, lanthanum, and lanthanum oxide.

7. The method of claim 1, the structure further comprising a barrier metal layer interposed between the sacrifice material and the insulating layer, the barrier metal layer comprising one or more selected from the group consisting of titanium oxide, titanium silicon oxide, manganese oxide, and manganese silicon oxide.

8. The method of claim 1, further comprising removing the photomask after etching the hardmask layer.

9. The method of claim 1, further comprising placing a metal hard mask interposed between the photomask and the hardmask layer, and transferring the trench pattern of the photomask to the hardmask by etching.

10. The method of claim 1, wherein filling the via with a sacrifice material self-forms a barrier metal layer interposed between the sacrifice material and the dielectric layer, wherein the barrier metal layer comprises one or more selected from the group consisting of titanium oxide, titanium silicon oxide, manganese oxide, and manganese silicon oxide.

11. A method for forming a via and trench pattern in a dielectric layer, comprising:
  providing a semiconductor structure formed on a semiconductor substrate comprising a base cap layer, a dielectric layer, a hardmask layer, and a metal hardmask layer formed over the hardmask layer, a photoabsorption layer and a first photomask having a via pattern patterned into the photomask;
  etching the metal hardmask layer to transfer the via pattern into the metal hardmask layer and performing ashing to remove the first photomask and the photoabsorption layer;
  etching the hardmask layer and the dielectric layer to form a via after performance of the ashing;
  filling the via with a sacrifice material, the sacrifice material comprising a metal or a metal compound and the sacrifice material forms a sacrifice layer over the hardmask layer;
  placing a second photomask over the sacrifice layer, the second photomask developed to have a trench pattern;
  etching one or more of the hardmask layer and the dielectric layer with the trench pattern; and
  removing the sacrifice material and the sacrifice layer by contact with a solution comprising one or more selected from the group consisting of an acid compound, water, a base compound, and an oxidant with the proviso that the sacrifice material and the sacrifice layer are not contacted by either a solution comprising more than about 30% by weight of an organic solvent or a solution comprising a fluorine-containing organic compound.

12. The method of claim 11, further comprising placing a second metal hardmask between the second photomask and the sacrifice layer.

13. The method of claim 11, wherein the dielectric layer comprises one or more selected from a porous SiCOH material and a low-k material.

14. The method of claim 11, wherein the sacrifice material does not comprise a material or film containing Si—O bonds.

15. The method of claim 11, wherein the sacrifice material comprises one or more selected from the group consisting of titanium, titanium nitride, tungsten, tungsten nitride, manganese, manganese oxide, tin, tin oxide, strontium oxide, strontium tin oxide, lanthanum, and lanthanum oxide.

16. The method of claim 11, wherein the acidic compound comprises a low oxidation acid.

* * * * *